United States Patent
Kolivoski et al.

(10) Patent No.: US 10,468,798 B2
(45) Date of Patent: Nov. 5, 2019

(54) ELECTRICAL CONTACT PRE-LOAD STRUCTURE

(71) Applicant: FCI USA LLC, Etters, PA (US)

(72) Inventors: Christopher J. Kolivoski, Lewisberry, PA (US); Michael Fogg, Etters, PA (US); Charles Copper, Hummelstown, PA (US); William Tanis, Mechanicsburg, PA (US); Mark Blaine Bruening, Mechanicsburg, PA (US)

(73) Assignee: FCI USA LLC, Etters, PA (US)

( * ) Notice: Subject to any disclaimer, the term of this patent is extended or adjusted under 35 U.S.C. 154(b) by 0 days.

(21) Appl. No.: 16/050,935

(22) Filed: Jul. 31, 2018

(65) Prior Publication Data

US 2019/0036251 A1 Jan. 31, 2019

Related U.S. Application Data

(60) Provisional application No. 62/539,244, filed on Jul. 31, 2017.

(51) Int. Cl.
| | |
|---|---|
| *H01R 12/72* | (2011.01) |
| *H01R 12/71* | (2011.01) |
| *H01R 12/89* | (2011.01) |
| *H01R 24/60* | (2011.01) |
| *H05K 1/11* | (2006.01) |

(52) U.S. Cl.
CPC ......... *H01R 12/721* (2013.01); *H01R 12/716* (2013.01); *H01R 12/89* (2013.01); *H01R 24/60* (2013.01); *H05K 1/117* (2013.01); *H05K 2201/09181* (2013.01); *H05K 2201/10863* (2013.01)

(58) Field of Classification Search
CPC .... H01R 12/721; H01R 12/716; H01R 12/89; H01R 24/60
USPC .......................................................... 439/79
See application file for complete search history.

(56) References Cited

U.S. PATENT DOCUMENTS

| | | | | |
|---|---|---|---|---|
| 6,547,577 | B2 * | 4/2003 | Fujita | H01R 12/721 439/140 |
| 7,744,380 | B2 * | 6/2010 | Shuey | H01R 12/716 439/607.5 |
| 8,096,832 | B2 * | 1/2012 | Minich | H01R 24/30 439/607.05 |

(Continued)

*Primary Examiner* — Alexander Gilman
(74) *Attorney, Agent, or Firm* — Wolf, Greenfield & Sacks, P.C.

(57) ABSTRACT

A card edge connector with an improved manner of creating a preload force on conductive elements held by a housing. The housing may include a member and an opening at a mating end. Each conductive element may have a contact portion curving inwardly relative to the opening and a tip extending from the contact portion towards the mating end. Each contact portion may form an electrical connection with an edge pad of a card to be inserted into the opening. The conductive elements may be configured to have a rest state in order to create a proper force to be exerted on the edge pads. The member may preload the conductive elements by contacting the conductive elements from a location farther from the mating end than the contact portion, which may avoid damage upon insertion of a card into the connector without the need for long tips of the conductive elements. As a result, the connector may operate at high frequencies.

20 Claims, 8 Drawing Sheets

(56) References Cited

U.S. PATENT DOCUMENTS

| | | | | |
|---|---|---|---|---|
| 8,550,855 B2* | 10/2013 | Zhang | ................ | H01R 13/6477 |
| | | | | 439/636 |
| 9,373,920 B2* | 6/2016 | Miki | ....................... | H01R 24/66 |
| 9,935,385 B2* | 4/2018 | Phillips | ................ | H01R 12/716 |
| 10,135,165 B2* | 11/2018 | Zuo | ....................... | H01R 12/721 |
| 2007/0123109 A1* | 5/2007 | Gillespie | ................ | H01R 13/26 |
| | | | | 439/634 |
| 2008/0200051 A1* | 8/2008 | Kolivoski | ............ | H01R 13/405 |
| | | | | 439/135 |
| 2010/0317234 A1* | 12/2010 | Yao | ....................... | H01R 12/716 |
| | | | | 439/637 |
| 2012/0083163 A1* | 4/2012 | Lee | ....................... | H01R 13/514 |
| | | | | 439/629 |
| 2012/0202363 A1* | 8/2012 | McNamara | ........ | H01R 13/6461 |
| | | | | 439/74 |

* cited by examiner

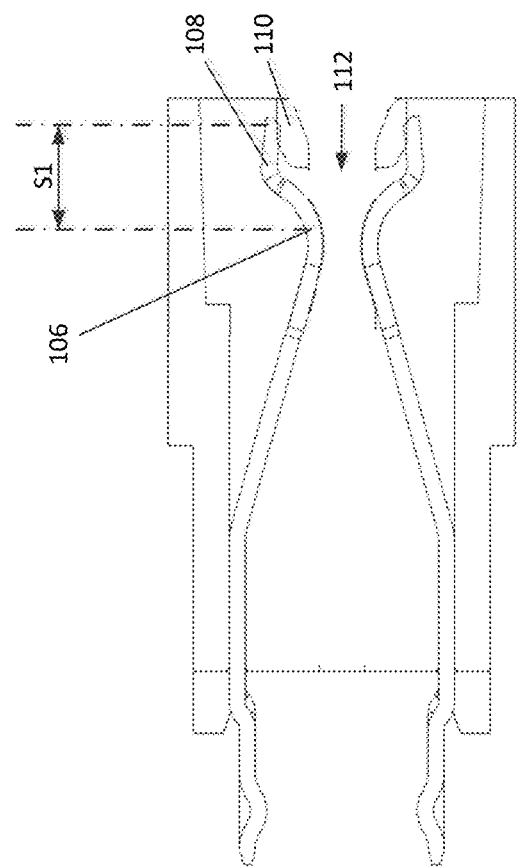
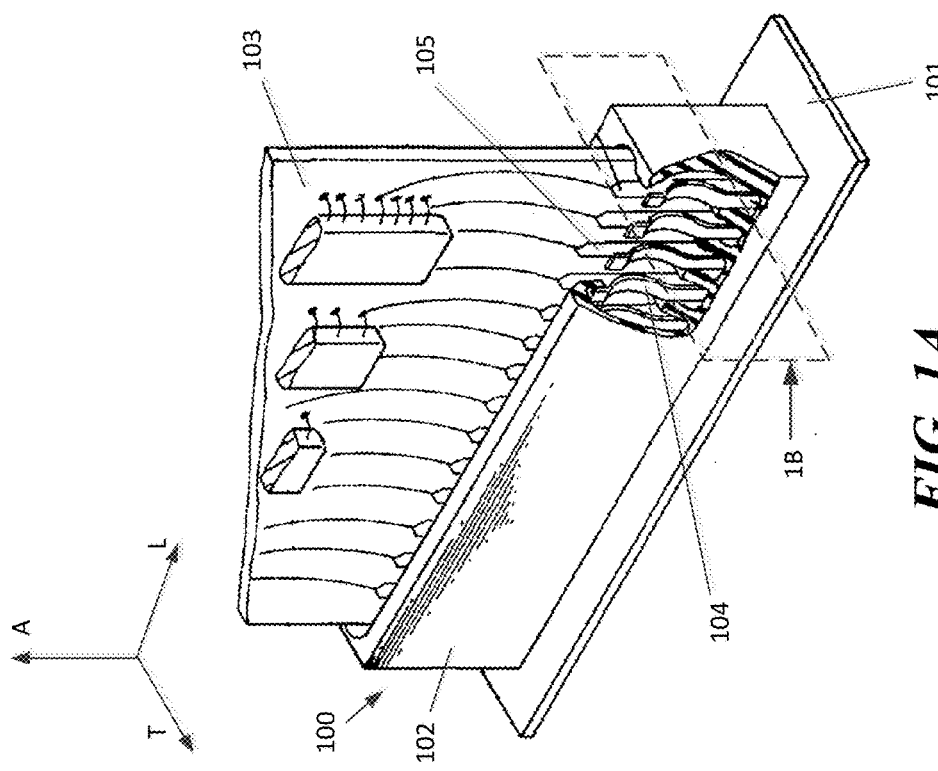
FIG. 1B
FIG. 1A

ELECTRICAL CONTACT PRE-LOAD STRUCTURE

CROSS REFERENCE TO RELATED APPLICATIONS

This patent application claims priority to and the benefit of U.S. Provisional Patent Application Ser. No. 62/539,244, filed on Jul. 31, 2017 and entitled "ELECTRICAL CONTACT PRE-LOAD STRUCTURE," which is hereby incorporated herein by reference in its entirety.

BACKGROUND

This application relates generally to interconnection systems, such as those including electrical connectors, used to interconnect electronic assemblies.

Electrical connectors are used in many electronic systems. It is generally easier and more cost effective to manufacture a system as separate electronic assemblies, such as printed circuit boards ("PCBs"), which may be joined together with electrical connectors. A known arrangement for joining several PCBs is to have one PCB serve as a backplane or a motherboard. Other PCBs, called "daughterboards" or "daughtercards", may be connected through the backplane or to the motherboard. As a specific example, a computer system may be assembled with a motherboard containing a processor and memory on a daughterboard.

Backplanes or motherboards may be made as PCBs onto which connectors are mounted. Conducting traces in the PCB may be electrically connected to signal conductors in the connectors so that signals may be routed through the connectors to components on or connected to the backplane or the motherboard. Daughtercards may also have connectors. A connector mounted on a daughtercard may be plugged into a connector mounted on the backplane or motherboard.

Alternatively, daughtercards may include contacts at an edge and can be directly connected to backplane or motherboard connectors. In this configuration, connectors mounted on the backplane or motherboard include slots into which the edges of the daughtercards are inserted. Compliant terminals in the connectors engage the contacts of the cards. Such connectors are sometimes referred to as card edge connectors.

FIG. 1A illustrates an electrical assembly comprising a card edge connector 100 with a conventional design. Motherboard 101 is connected to daughtercard 103 through card edge connector 100. Connector 100 includes a plurality of conductive elements 104 held by a housing 102. Housing 102 has an opening 112 into which daughtercard 103 is inserted. The conductive elements 104 are positioned within housing 102 such that they will make contact with pads on daughtercard 103 when inserted into opening 112. FIG. 1B shows a cross-section view of the card edge connector in FIG. 1A. Each conductive element 104 comprises a contact portion 106 and a tip 108 extending from the contact portion.

In operation, an edge of a daughtercard will be inserted into opening 112. That insertion will deflect the conductive element. The mating portion of the conductive element is a beam such that deflecting the beam causes the mating portion to generate a spring force against a pad on the surface of the daughter card. The amount of spring force depends on the properties of the conductive element as well as the amount the conductive element is deflected from its rest state in which no force is applied to the conductive element.

To increase the amount of the spring force generated, the conductive elements may be configured, such as by deforming the conductive elements or mounting the conductive element, to increase the amount that the conductive element is deflected from its rest state to be positioned in the mated configuration. At its rest state, a conductive element may be offset, in a direction opposite the direction in which the conductive element is deflected, relative to its position when mated to a pad on a card.

When the conductive element is configured in this way, at its rest state, the tip of the conductive element would be positioned in a path of a card being inserted into the connector. To ensure that the edge of the card does not hit the tips of the conductive elements, housing 102 may be configured to hold the tips of the conductive elements away from the center of opening 112. FIG. 1B illustrates shelves 110 that engage tips 108 of the contacts. In this way, the conductive elements are spread, such that they are not in opening 112 and cannot be struck by an edge of a board inserted into slot 112. This process of mounting a conductive element to increase its contact force in the mated position, yet spreading the tips of the conductive elements while in an unmated configuration, is sometimes referred to as "preloading".

Electronic systems generally have gotten smaller, faster, and functionally more complex. Because of these changes, the number of circuits in a given area of an electronic system, along with the frequencies at which the circuits operate, have increased significantly in recent years. Measures of signal integrity (SI) of conventional card edge connectors deteriorate at high speeds and at high densities, creating challenges in the design of card edge connectors for modern electronic assemblies.

BRIEF SUMMARY

Aspects of the present disclosure relate to improved high speed interconnection system. Very high speed performance may be achieved in accordance with some embodiments by a member that preloads a conductive element having a contact portion curving inwardly relative to an opening by generating a preload force from a position farther from a mating end of the conductive element than the contact portion.

Accordingly, some embodiments relate to a connector. The connector may include a housing and at least one compliant, conductive element. The housing may have an opening at an end and a member. The at least one compliant, conductive element may have a contact portion curving inwardly relative to the opening. The at least one compliant, conductive element has a rest state. The member may contact the at least one conductive element from a location farther from the end than the contact portion. The contact between the at least one compliant, conductive element and the member may deflect the at least one compliant, conductive element from its rest state.

In some embodiments, an electrical assembly is provided. The electrical assembly may include a card and a connector. The connector may include a housing and at least one conductive element. The housing may have an opening at an end and a member. The at least one conductive element may have a mating end, a mounting end opposite the mating end, a contact portion curving inwardly relative to the opening, and an intermediate portion that extends between the mounting end and the contact portion. The contact portion of the at least one conductive element of the connector may engage with the card. The member may be positioned farther from the end than the contact portion of the at least one conductive element along a lateral direction. At least a portion of the member may be positioned between the card and the intermediate portion of the at least one conductive element along a transverse direction perpendicular to the lateral direction.

In another aspect, embodiments may relate to a method of manufacturing a connector comprising a plurality of conductive elements having mounting ends and contact portions. The method may include positioning an insulative member between a first plurality of conductive elements held in a first leadframe assembly and a second plurality of conductive elements held in a second leadframe assembly, securing the first leadframe assembly to the second leadframe assembly such that contact portions of the first plurality of conductive elements are flexed away from contact portions of the second plurality of conductive elements, and mounting the first leadframe assembly in a housing of the connector such that the contact portions of the first plurality of conductive elements and the contact portions of the second plurality of conductive elements are accessible to mating conductive elements through at least one opening in the housing.

In another aspect, embodiments may relate to a method of operating a connector comprising a housing comprising an opening at an end and a member, and at least one conductive element comprising a contact portion curving inwardly into the opening. The member may contact the at least one conductive element from a location farther from the end than the contact portion. The method may include inserting a card into the opening, engaging the card with the contact portion of the at least one conductive element, and disconnecting the at least one conductive element from the member at the location farther from the end than the contact portion of the at least one conductive element.

The forgoing is a non-limiting summary of the invention, which is defined by the attached claims.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings:

FIG. 1A is a perspective view of an electrical assembly comprising a card edge connector of a conventional design;

FIG. 1B is a cross-sectional view of region 1B in FIG. 1A;

DETAILED DESCRIPTION

The inventors have recognized and appreciated that the operating frequency of a connector may be increased with an improved manner of providing preloaded conductive elements. The inventors have recognized and appreciated that conductive elements, conventionally shaped to provide a preload force, may cause stub resonances within the operating frequency range of the connector, particularly for high speed, high density card edge connectors. Such connectors, for example, may exhibit a resonance at about 25 GHz. Such resonances cause signal integrity deterioration at higher frequencies. The inventors have further recognized and appreciated improved connector designs that can reduce the size of tips of the beams. As a result, the connector may operate at high frequencies, such as greater than 40 Gbps NRZ. In some embodiments, the connector may operate at 56 Gbps NRZ or higher.

These increased operating frequencies are enabled by a member within a connector housing that deflects conductive elements away from the path of a mating component. In the example provided herein, the connector is a card edge connector and the mating component is an edge of a PCB. In contrast to a conventional arrangement in which the preloaded conductive elements are held at their tips, the member may contact the conductive elements proximal of the contact portions of the conductive elements. The inventors have recognized and appreciated that this configuration enables a reduction of the length of the tips of the conductive element, thereby improving performance of the connector.

Figure 2A:
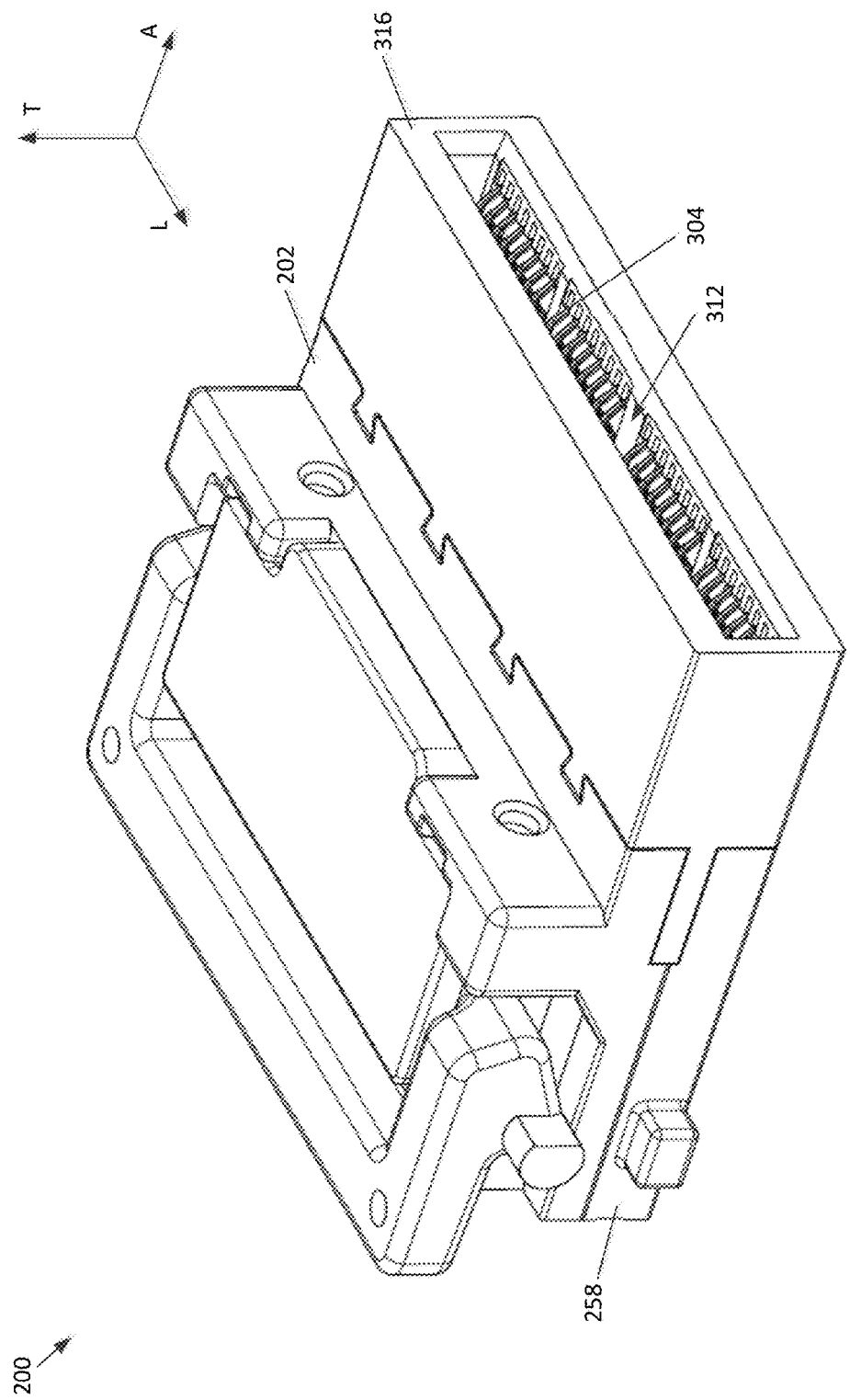
FIG. 2A is a perspective view of a card edge connector, according to some embodiments.

FIG. 2A shows a perspective view of a card edge connector 200, according to some embodiments. The card edge connector may include a housing 202 holding a plurality of conductive elements 304.

The housing 202 may include an opening 312, exposing conductive elements 304 at a mating end 316, and a mounting end 258 opposite the mating end. The connector may be connected to a substrate such as a PCB (e.g., a motherboard) at the mounting end. Connection to a substrate may be made in any suitable way, including via contact tails that are shaped as press-fits or gull wing solder tabs that receive solder balls. Such connections to a PCB may be made using known techniques. However, other mounting configurations are contemplated. In some embodiments, for example, the mounting end may be configured to be connected to cables that include electrical signal conductors and drain wires.

The opening 312 may be sized to receive a mating component, which in some embodiments may be a card. The card may be implemented in any suitable way, such as with a printed circuit board. As in a connector of a conventional design, the card may have an array of edge pads electrically connected to circuitry on the printed circuit board which must be interconnected to external circuits. Alternatively, the card may be a paddle card of a cable connector, which may or may not include circuitry, but may be connected to cables that are to be connected to connector 200. The shape and position of conductive elements 304 within connector 200 may be established based on the configuration of the card to be inserted into connector 200.

Each of the conductive elements 304 may have a contact portion 306 curving inwardly relative to the opening. The contact portion may be identifiable based on its shape. In the embodiment illustrated, the contact portions have convex surfaces facing into opening 312 such that the convex surfaces will contact a pad of a card edge inserted into opening 312. Alternatively or additionally, the contact portion may be identified by its material composition, including a surface coating. A contact portion may have material that better resists oxidation, has lower resistance or is more ductile than other portions of the conductive element. For example, a contact portion may be totally or partially coated with gold or other metal that resists oxidation. The gold, for example, may be selectively plated at the apex of the contact portion such that the gold plated portion makes contact with the mating component inserted into the opening.

Figure 2B:
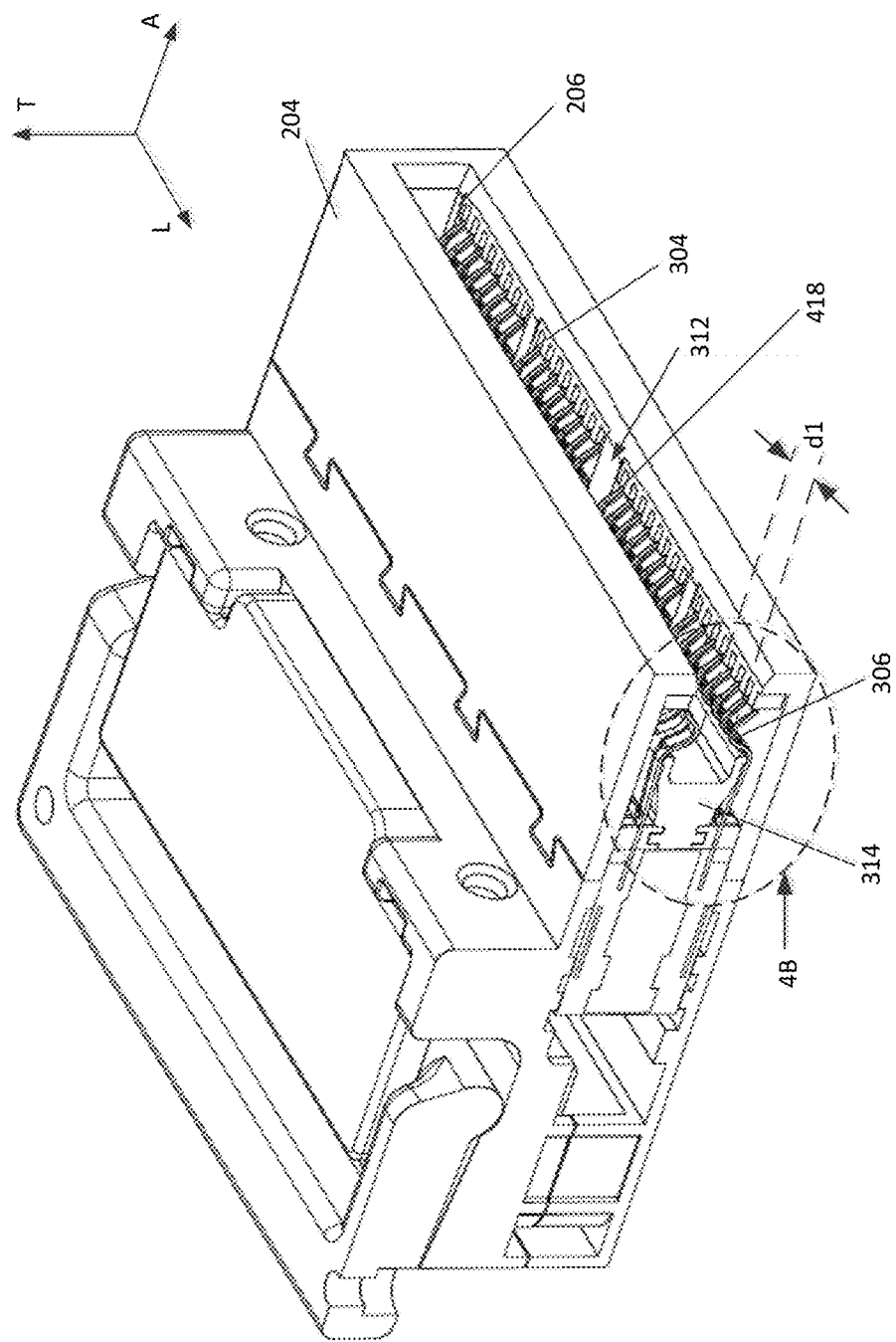
FIG. 2B is a perspective view of the card edge connector of FIG. 2A, with a left sidewall cutaway.

In the view of FIG. 2B, the left sidewall of connector housing 202 is cutaway, exposing additional detail of the contact portions within opening 312. FIG. 2B illustrates that the contact portions 306 may extend into the opening 312 leaving a free space having a distance d1 along a transverse direction. In the example of FIG. 2B, the transverse direction is represented by T in the legend of FIG. 2B). In this example, the opening 312 is an elongated slot extending in a direction labeled L. The contact portions line the upper and lower floors 204 and 206 of that slot such that they will make contact with pads on the upper and lower surfaces of a printed circuit board inserted into the slot. The transverse direction is perpendicular to the longitudinal direction.

The contacts portions 306 may be shaped and mounted such that the distance d1 is smaller than the thickness of the card. In the embodiment illustrated, in which conductive elements 304 line opposing floors 204 and 206 of opening 312, the free space is defined by the separation of contact portions of opposing conductive elements. In embodiments in which conductive elements 304 line only one floor of opening 312, the free space may be defined by the space between the contact portions and the opposing floors of opening 312. In the embodiment illustrated, the contact portions are beams that are mounted with their distal ends 418 free to move. As a result of this distance d1 being less than the thickness of the card, the conductive elements will be deflected upon insertion of the card. The amount of this deflection, in part, dictates the amount of contact force on the card.

In accordance with some embodiment's, conductive elements 304 may be configured to have a rest state to increase mating force. In contrast to conventional designs, in which the tips of preloaded contacts are held out of opening 112 by shelves 110 (FIG. 1B), tips of conductive elements 304 may be held out of the path of an edge of a circuit board inserted into opening 312 in other ways, including by a housing member that makes contact with the compliant portions of contacts 304 other than at the tip. The contact may be adequate to spread the conductive elements to reduce the chances of an edge of a board inserted into opening 312 striking the tips, which can damage the connector and/or preclude proper operation of an electronic system using the connector.

In the embodiment illustrated, member 314 may spread the conductive elements by making contact with the conductive elements at a location farther from the mating end than the contact portions. Member 314 may be insulative, and may be made of materials such as are used in manufacture of conventional connector housings, such as plastic or nylon. The housing, including the member, may be formed as one or more pieces. The pieces may be molded or formed in any other suitable way. When formed of separate pieces, those pieces may be held together in any suitable way, including using adhesive, snap-fit features or other interlocking features, such as dove tails and corresponding grooves.

Card edge connector 200 may provide electrical connection to a board as contact portions 306 of the conductive elements 304 press against edge pads of the board. The contact portions may be designed to press with a predetermined force, which may be in the range of 10-60 N, or may be in some other range in other embodiments, such as between 15-40 N or between 20-40 N. The force may be increased at least 20% relative to a non-preloaded contact, or in some embodiments may be increased by at least 25%, 30%, 40%, 50%, up to 100% or, in some embodiments, the force may be increased by more than 100%. However, the amount of contact force, and amount of increase in contact force from preloading the contacts may be designed with any suitable value to ensure a reliable electrical connection as well as a secure mechanical connection between the connector and the card. Regardless of the desired mating contact force, the distance d1 may be adjusted by the shape and position of member 314, to ensure that a card may be inserted into opening 312 without striking the tips of the contacts 304.

Figure 3A:
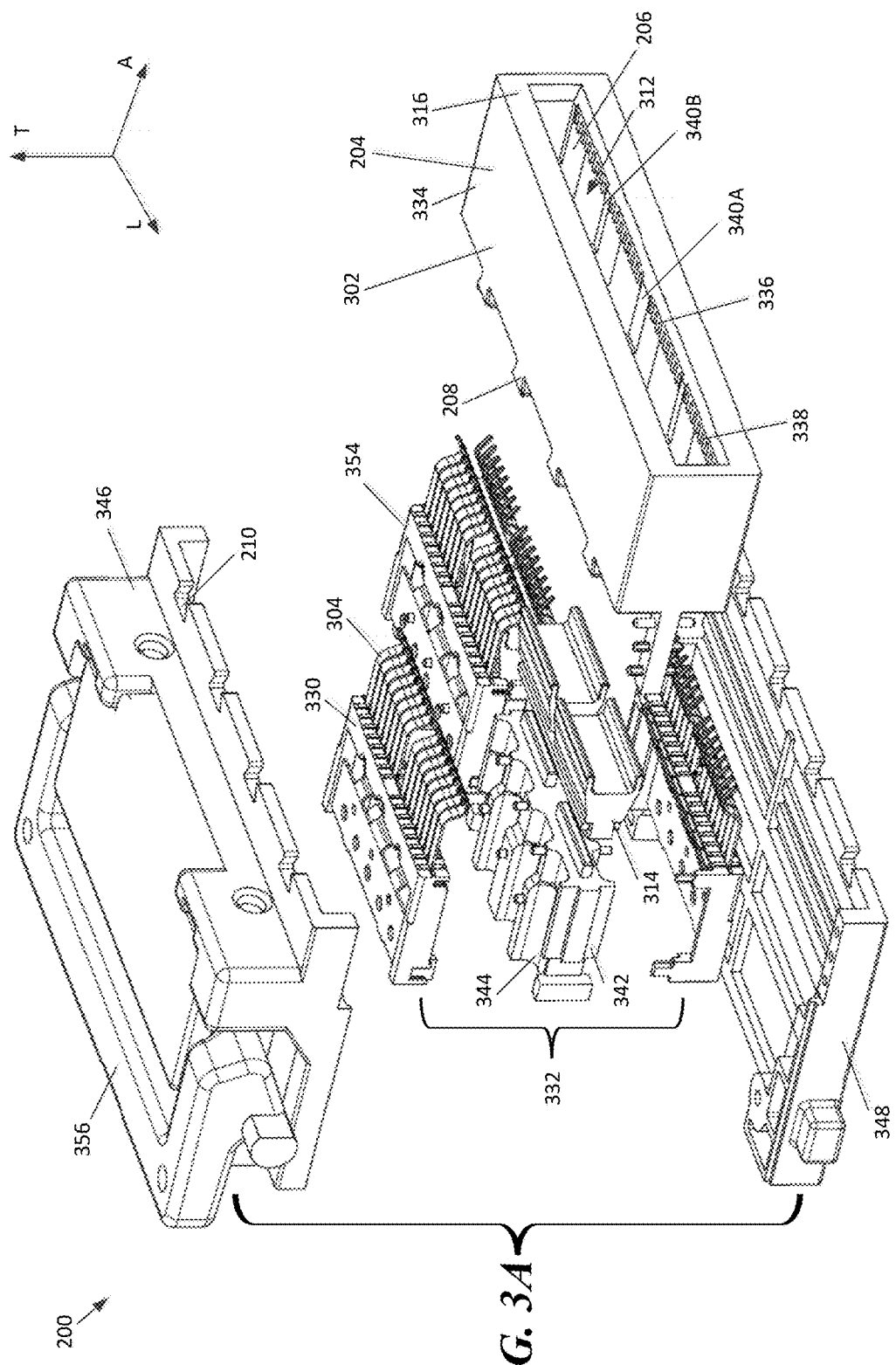
FIG. 3A is an exploded view of the card edge connector of FIG. 2A.

FIG. 3A shows an exploded view of a card edge connector 200, according to some embodiments. In the embodiment illustrated, connector 200 is assembled from housing 302 and subassemblies 312 holding conductive elements 304.

In the embodiment illustrated, the housing 302 has a front housing piece 334, an upper housing piece 346, and a lower housing piece 348. The front housing piece is attached to the upper housing piece and lower housing piece. The front housing piece includes opening 312. In the embodiment illustrated, the upper and lower housing pieces are shaped to receive the subassemblies between them when attached to one another. The upper and lower housing pieces may have complimentary engagement features, such as posts and holes, that hold those pieces together. Secure engagement of the upper and lower housing pieces may be achieved with interference fit between the engagement features. Alternatively or additionally, snap fit features, an adhesive, welding or other attachment mechanism may be used to hold the first and second housing pieces together.

The front housing piece may similarly have attachment features, complementary to those on the upper and lower housing pieces, to hold the front housing piece to the upper and lower housing pieces. In the embodiment illustrated in FIG. 3A, the attachment features on the front housing piece are dove tailed tabs 208 and the corresponding features on the upper and lower housing pieces are grooves 210. As with the features used to hold the upper and lower housing pieces together, attachment of the front housing piece to the upper and lower housing pieces may be achieved through an interference fit, and/or may be enhanced through the use of an adhesive, welding, heat staking or other suitable attachment mechanism.

Front housing 334 may include opening 312 at a mating end 316 of the housing 302, a plurality of walls 336 having chambers 338, and slots 340A, 340B. Each chamber may receive one or more of the conductive elements when the conductive elements are inserted into the front housing. Conductive elements in adjacent chambers may be separated and insulated from one another by the portions of walls 336 between the chambers 338.

Housing 302 may include features suitable for particular uses of connector 200. For example, upper housing 346 may include a handle 356, for example to release a latch holding a card in the housing. The handle may have inner springs such that it returns to the latched position when not activated.

In the embodiment illustrated, conductive elements 304 are integrated into subassemblies 332 that fit within a cavity in the housing 302 formed between the upper housing piece 346 and the lower housing piece 348. In some embodiments, the subassemblies may have outer surfaces with recesses, projections or other features that are complementary to features on the inner surfaces of the upper and lower housing pieces. In some embodiments, the securing the first and second housing pieces together, with the subassemblies in between them, may result in engagement of the complementary features on the housing pieces and the subassemblies, such that the subassemblies are held in the housing. However, other attachment mechanisms alternatively or additionally may be used to hold the subassemblies within the housing.

In the example of FIG. 3A, two subassemblies are shown with each subassembly including a portion of the contacts 304 for each of the two opposing rows, with identical contacts in each row. Each row is aligned with a side of opening 312. However, it should be appreciated that any suitable number of subassemblies may be used. When connector 200 is assembled, the mating contact portions of conductive elements 304 will extend into front housing piece 334, so as to line the upper and lower floors 204 and 206 of opening 312.

Figure 3B:
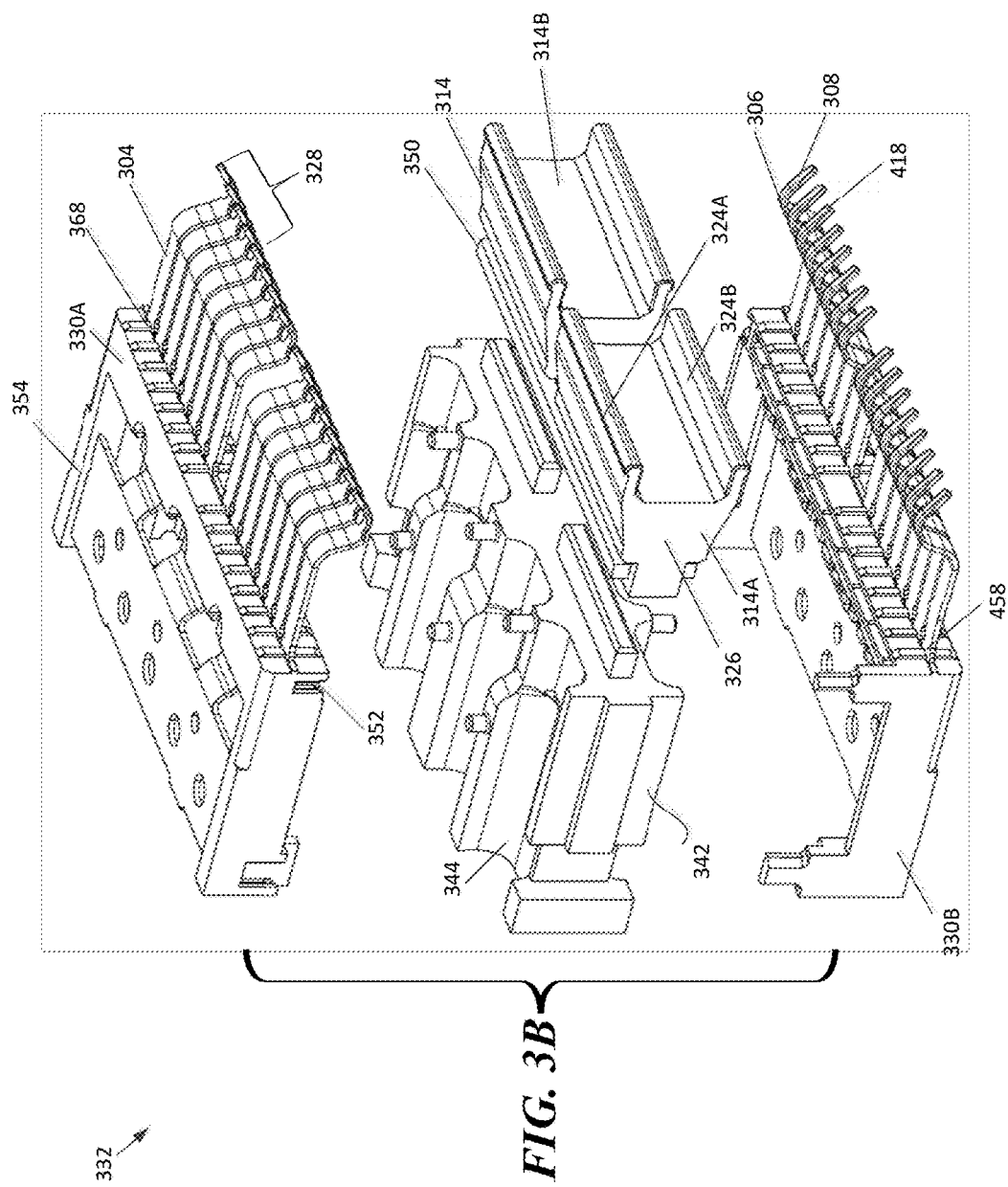
FIG. 3B is an exploded view of a subassembly of the card edge connector of FIG. 3A.

FIG. 3B illustrates an exploded view of subassembly 332 of the card edge connector 200. As shown in greater detail in FIG. 3B, each subassembly 332 may include a subassembly housing 354 holding a plurality of conductive elements 304. The portions of conductive elements 304 extending from housing 354 may form beams, as they are cantilevered as a result of having tips 308 extending from subassembly housing 354. Those beams may be compliant, and may provide a spring force when deflected from their rest states. The portions of the conductive elements 304 extending from the housing may form mating contacts. Each of the mating contacts may have a contact portion 306, which is here formed as a result of a curve in the extending portion of conductive element 304 towards the lateral centerline of opening 312. That curved portion is positioned so as to make contact with a pad on a card inserted into opening 312.

Each of the plurality of conductive elements may have contact portion 306 in a bowed configuration and may terminate at tip 308 extending in the direction of mating end 316 (shown in FIG. 3A). The plurality of conductive elements may be configured into a plurality of groups 328. Each group may include four conductive elements to receive a pair of differential signals and corresponding reference signals. However, the conductive elements may be present in any suitable number and may have any suitable function.

In the embodiment illustrated in FIGS. 3A and 3B, the subassemblies 332 are implemented with insert molded lead frame assemblies. Subassembly housing 354 may be formed, in part, by insulative material of the insert molded lead frame assemblies molded around intermediate portions of multiple conductive elements 304. Alternatively or additionally, the housing may be formed from other components, such as a central housing 342. In the embodiment illustrated in FIG. 3B, the subassembly includes an upper leadframe assembly 330A, a lower leadframe assembly 330B, a member 314, and a central housing 342.

The illustrated embodiment is configured to form a cable connector. The central housing 342 of the subassembly housing may include notches 344. Each notch may be sized to receive one or more cables each having one or more signal conductors and associated ground conductors. For example, each cable may carry two pairs of differential signals and reference signals on each side of the pair of differential signals. The connection between a group of the conductive elements and exposed wires of a cable may be established in the notch. In the embodiment illustrated in FIG. 3B in which the connector 200 is designed to be attached to a cable, central housing 342 may be shaped to receive cables to be attached to mounting ends of the conductive elements. However, the components within the housing of connector 200 may have any suitable shape to support desired functions, such as being attached to a circuit board.

In the embodiment illustrated in FIG. 3B, the housings of upper and lower leadframe assemblies 330A and 330B contact central housing 342. Central housing 342 may establish the spacing between the leadframe assemblies. In some embodiments, the leadframe assemblies may be attached to central housing 342 using complementary engagement features such as posts 212 and holes 214. Attachment mechanisms, such as interference fit, snap fit, welding, or adhesive, may be used to secure the components of the subassemblies together. Alternatively or additionally, those components may be held together by force generated when upper housing piece 346 is secured to lower housing piece 348 (FIG. 3A).

In the embodiment illustrated, the thickness of central housing 342 may set the spacing between the housing portions of upper and lower leadframe assemblies 332. Central housing 342, or a member extending from central housing portion 342, may separately establish separation between the conductive elements 304. In this way, the dimension d1 (FIG. 2B) may be established by the construction of the subassemblies, including the dimensions of the housing. In FIG. 3B, member 314 is shown for establishing separating between conductive elements 304 lining opposite floors 204 and 206 of opening 312 (FIG. 2B). Member 314 may be a portion of central housing 342, being integrally molded with the rest of central housing 342. Alternatively, member 314 may be separately formed and attached to central housing 342.

Establishing the spacing with a housing member in this way enables the conductive elements to be preloaded, but reduces the chances of the distal ends 418 of the conductive elements being struck by a card inserted in opening 312, without the need for long tips on the conductive elements that engage a feature on the front housing portion adjacent opening 312. As the conductive elements are preloaded, they have a rest state. The conductive elements are shaped such that the contact surfaces of the conductive elements, absent some component to move them from their rest state, extend so far into opening 312 that they extend beyond the location that the surface of a pad on a card if the card were inserted into opening 312. In this configuration, there is a risk that the connector could be damaged or operate improperly, as the edge of a circuit board might strike the ends of the conductive elements when the card is inserted into opening 312. However, member 314 is sized and positioned to move the distal ends 418 of the conductive elements out of the path of a card inserted into opening 312, reducing the chance of damage or improper operation.

In the embodiment illustrated, member 314 of the subassembly housing includes an upper arm 324A, a lower arm 324B, and a bridge 326 connecting the upper and lower arms. The upper and lower arms may be sized and positioned to contact the beams at the ends of the conducive elements at a location between their contact portions and their proximal/mounting ends 458 where they are held within the subassembly housing. Bridge 326 may have a thickness in the transverse direction approximately the same as or slightly larger than the thickness of a card that connector 200 is designed to receive. With these dimensions, a card inserted into connector 200 may fit between the upper and lower arms. Upper arm 324A may contact the conductive elements 304 of the upper leadframe assembly 330A at a location farther from the tips 308 than the contact portions 306 of the conductive elements; lower arm 324B may contact the conductive elements held by the lower leadframe assembly 330B from a location farther from the tips than the contact portions of the conductive element. As a result of this contact, the tips of the conductive elements may be moved sufficiently away from the centerline of opening 312 that they will not be struck by an edge of a card inserted into opening 312.

Each subassembly may be manufactured by separately forming upper and lower leadframe assemblies 330A and 330B. Central housing portion 342, including member 314, may be positioned between upper and lower leadframe assemblies 330A and 330B. Upper and lower leadframe assemblies may be secured to each other and/or to central housing portion 342, using techniques as described above or any other suitable technique. Once assembled, member 314 holds the mating ends of the conductive elements 304 apart a sufficient distance to ensure that the tips 308 of the conductive elements are held out of opening 312 (FIG. 2B), even though the curved contact portions 306 are exposed in opening 312 such that they will press against a surface of a card inserted in opening 312.

In the illustrated example, the member 314 has a first portion 314A and a second portion 314B. Each portion is shared by two opposing groups of conductive elements. It should be appreciated that each portion of member 314 is shaped to flex a subset of the conductive members from their rest states when member 314 is combined into a subassembly with upper leadframe assembly 330A and lower leadframe assembly 330B. However, a member need not be separated into portions or may have more than two portions. It is also not necessary for each portion to be shared by two opposing groups. The member and the central housing 342 may be made as separate pieces having matching joints; alternatively, they may be unitarily molded. It also should be appreciated that the design of the member is not limited by foregoing description, for example, in the case of a connector including a single row of conductive elements, a corresponding member may include one arm deflecting a single row of conductive elements.

Figure 4A:
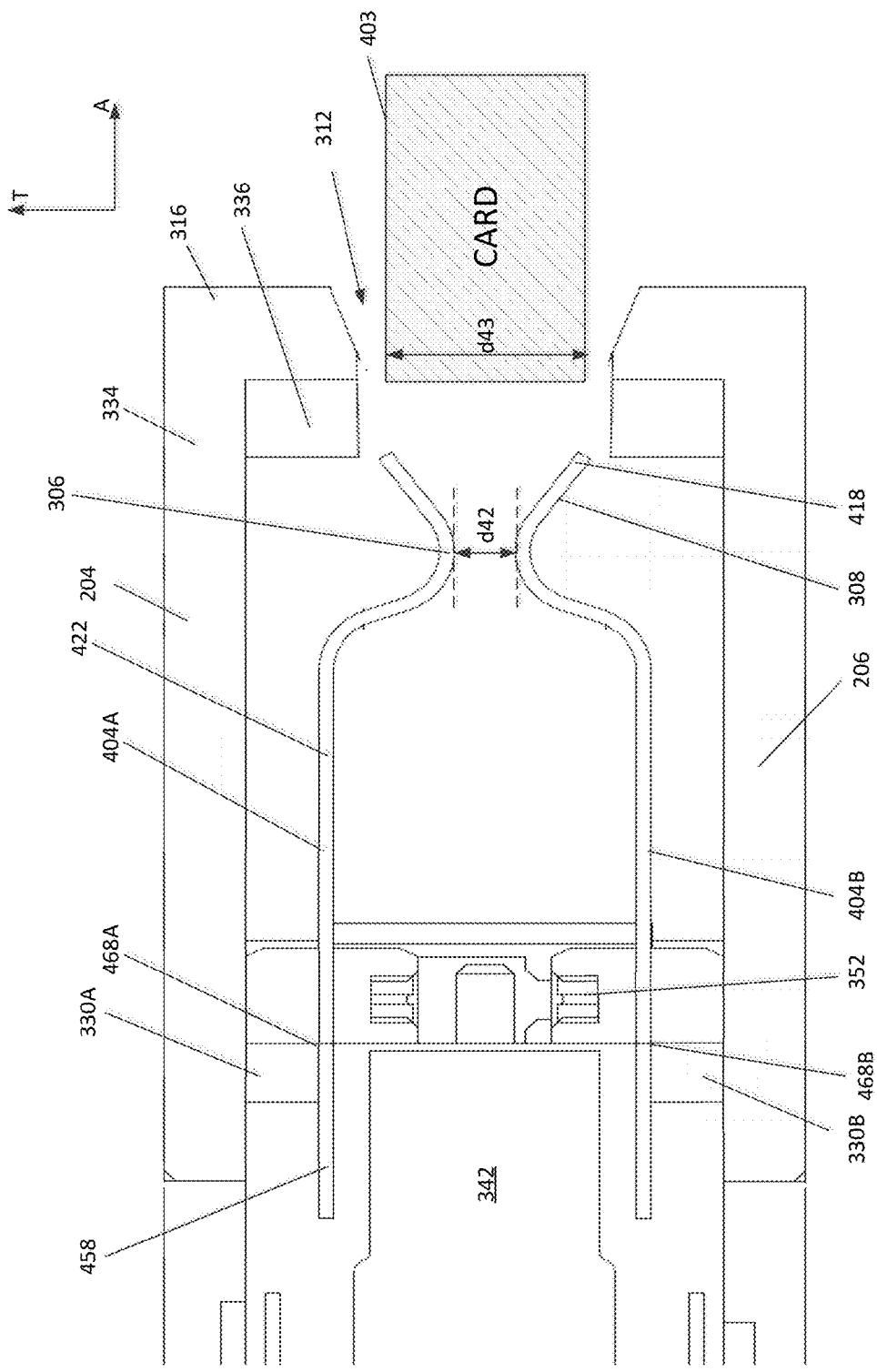
FIG. 4A is a cross-sectional view of the circled region marked by 4B in FIG. 2B, excluding the member 314, showing a pair of conductive elements at their rest states, according to some embodiments.

A consequence of spreading preloaded conductive elements by contacting them at a location farther from the mating end than the contact portions of the conductive elements can be seen by comparison of FIGS. 4A-4C and FIG. 1B. FIG. 4A is a side view of the circled region marked by 4B in FIG. 2B, excluding the member 314. FIG. 4A shows a pair of conductive elements at rest states, according to some embodiments. Here, the conductive elements of the pair are positioned along opposing floors 204 and 206 of opening 312 in front housing 334. The pair of conductive elements may be held by the housing portions of leadframe assemblies 330A and 330B, respectively.

Front housing 334 may have walls 336 and an opening 312 at a mating end 316. The pair of conductive elements may include a first conductive element 404A and a second conductive element 404B. Each of the conductive elements of the pair may have a mating end 418, a mounting end 458 opposite the mating end. Each of the conductive elements may be held by some portion of a housing of the connector, which in this example are housings of upper leadframe assembly 330A and lower leadframe assembly 330B. Extending from that housing, a contact portion 306 curves inwardly into the opening 312. The conductive element may also have an intermediate portion 422 that extends between the mounting end and the contact portion, and a tip 308 extending from the contact portion adjacent the mating end 316 of the connector.

Central housing 342 may be positioned between upper and lower leadframes assemblies 330A and 330B. The contact portions of conductive elements 404A and 404B at their rest states may be separated by a distance d42. The d42 is less than the height of opening 312 and that distance may be less than the thickness d43 of a card 403 to be inserted in the opening. If the card can be properly inserted, conductive elements 404A and 404B may be deflected from their rest states upon insertion of a card such that a force may be exerted against the card. Tips 308 are sloped relative to the insertion direction of the card such that, as a card is inserted, a leading edge of the card can engage those sloping surfaces. As a result of the camming action of the sloped surfaces, motion of the card in an insertion direction is converted into deflection of conductive elements 404A and 404B in a direction perpendicular to the insertion direction.

However, as can be seen in FIG. 4A, distal ends 418 of tips 308 of the conductive elements 404A and 404B are not shielded by walls 336 of front housing piece such that the forward edge of the card can strike the ends of conductive elements 404A and 404B, rather than slide along the sloped surfaces. In that scenario, conductive elements 404A and 404B may be damaged or a reliable contact may not be formed.

Figure 4B:
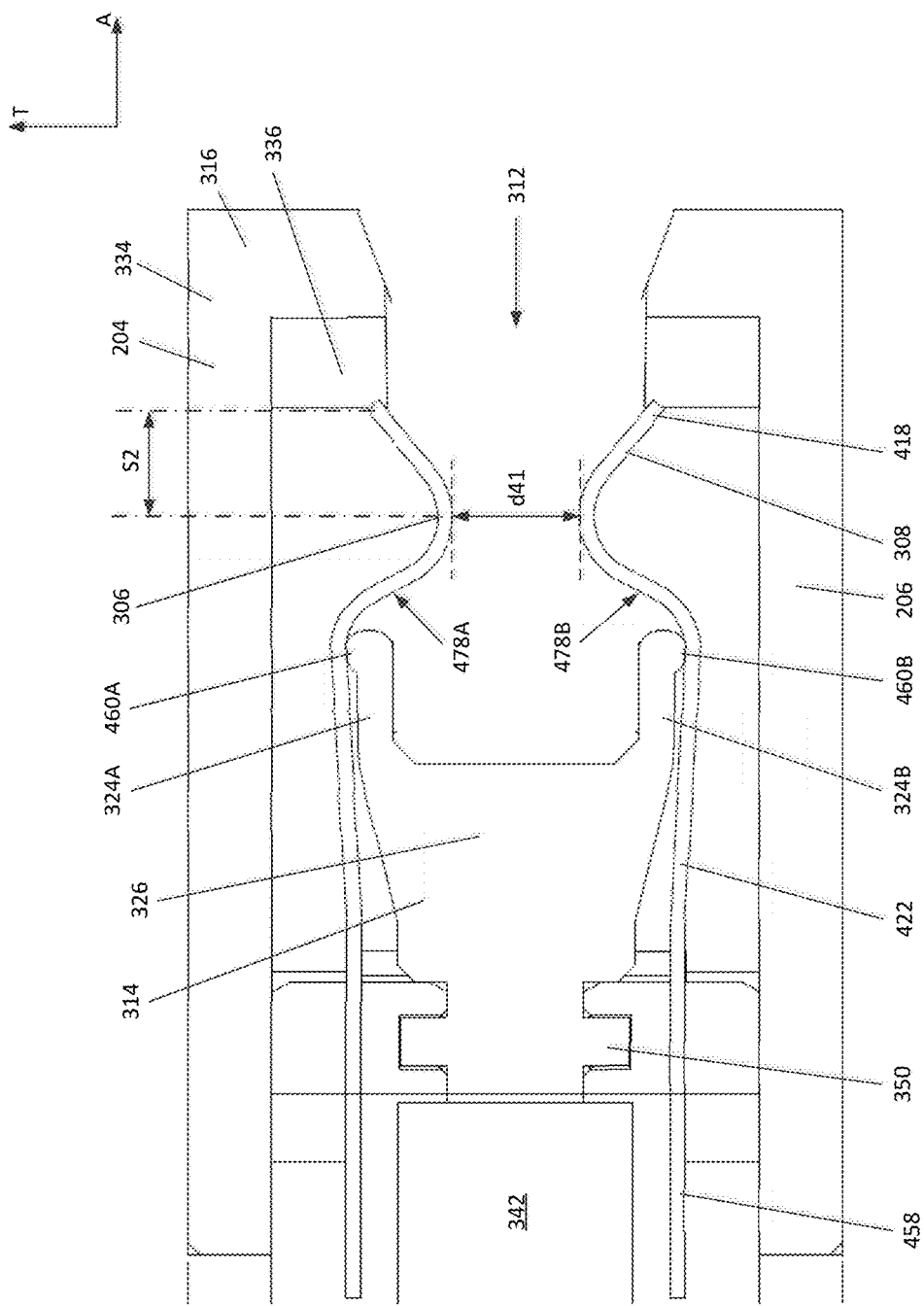
FIG. 4B is a cross-sectional view of the circled region marked by 4B in FIG. 2B, showing the pair of conductive elements in FIG. 4A are flexed away from their rest states, according to some embodiments.

FIG. 4B is a cross-sectional view of the circled region marked by 4B in FIG. 2B, showing the pair of conductive elements 404A, 404B are flexed away from their rest states, according to some embodiments. As a result of the flexing, the distal ends 418 of conductive elements 404A, 404B are moved out of the path of a card inserted into opening 412. In this state, the likelihood of the leading edge of the card hitting the ends of the tips, rather than sliding along the sloped surfaces, is greatly reduced.

In the example of FIG. 4B, that flexing is provided by member 314. The member may include an upper arm 324A, a lower arm 324B, a bridge 326 connecting the upper and lower arm. The upper arm may press against a surface 478A of the intermediate portion of the first conductive element 404A from a location 460A. The lower arm may press against a surface 478B of the intermediate portion of the second conductive element 404B from a location 460B. The surfaces 478A and 478B may face the opening and thus each other. As a result, the pair of conductive elements 404A, 404B may be flexed away from their rest states and may be spread in the opening. The contact portions 306 of conductive elements 404A and 404B are separated by distance d41, which is larger than d42 (FIG. 4A). Additionally, the distal ends 418 of tips 308 are separated by a distance exceeding the width of opening 312 in the transverse direction. Consequently, the tips are protected by portions of walls 336 from being struck by a card inserted into opening 312. Rather, a card inserted into opening 312 will be aligned with the sloped portions such that the conductive elements 404A, 404B will be deflected, in a direction perpendicular to the insertion direction, as intended. As a result of member 314 spreading conductive elements 404A, 404B, the conductive elements is preloaded to provide a desired mating force against the card with significantly reduced risk of the card hitting the distal ends 418 and potentially damaging conductive elements 404A, 404B.

The manner in which the preloaded conductive elements 404A, 404B are protected from damage differs from the conventional approach of FIG. 1B in a way that can enhance the electrical performance of the connector. The inventors have recognized and appreciated that conventional preloaded conductive elements are designed to protect the tips 108 using shelves 110 (FIG. 1B) or to otherwise hold the tips out of the way of a card to be inserted. Deflecting the conductive elements based on contact at their tips can have an undesired effect on electrical performance.

To be long enough to reach the shelves inside the front wall of the connector housing, the tips may extend a length of S1 (FIG. 1B) from the contact portions 106, which may cause stub resonances within the operating frequency range of the connector, particularly for high speed, high density card edge connectors. Such connectors, for example, may exhibit a resonance at about 25 GHz. Such resonances cause signal integrity deterioration at high frequency, and lead to undesirable connector performance in any application in which the operating frequency encompasses the frequency of the resonance. The inventors have further recognized and appreciated that preloading conductive elements with the member 314 can reduce the need for long tips. As a result, tips 408 may extend from the contact portions 406 a length of S2 (FIG. 4B) that may be less than S1. As the resonant frequency is inversely proportional to the length of the stub, a shorter stub results in a higher frequency resonant, allowing a higher operating frequency range of the connector without encompassing the resonance frequency. The connector with improved designs may operate at high frequencies, such as greater than 40 Gbps NRZ. In some embodiments, the connector may operate at 56 Gbps NRZ or higher.

In accordance with some embodiments, the distance S2, from the contact point to the tip of the conductive element, may be less than one half wavelength (in air) at frequencies corresponding to the desired operating frequency, such as 25, 40 o or 56 Gbps NRZ. In some embodiments, the distance S2 may be a faction of the length of the beam forming the mating contact portion, which may be measured from the housing holding the proximal end of that beam to the tip. That fraction may be, in some embodiments, less than 30%, less than 25%, less than 20%, less than 15% or less than 10%, for example.

Figure 4C:
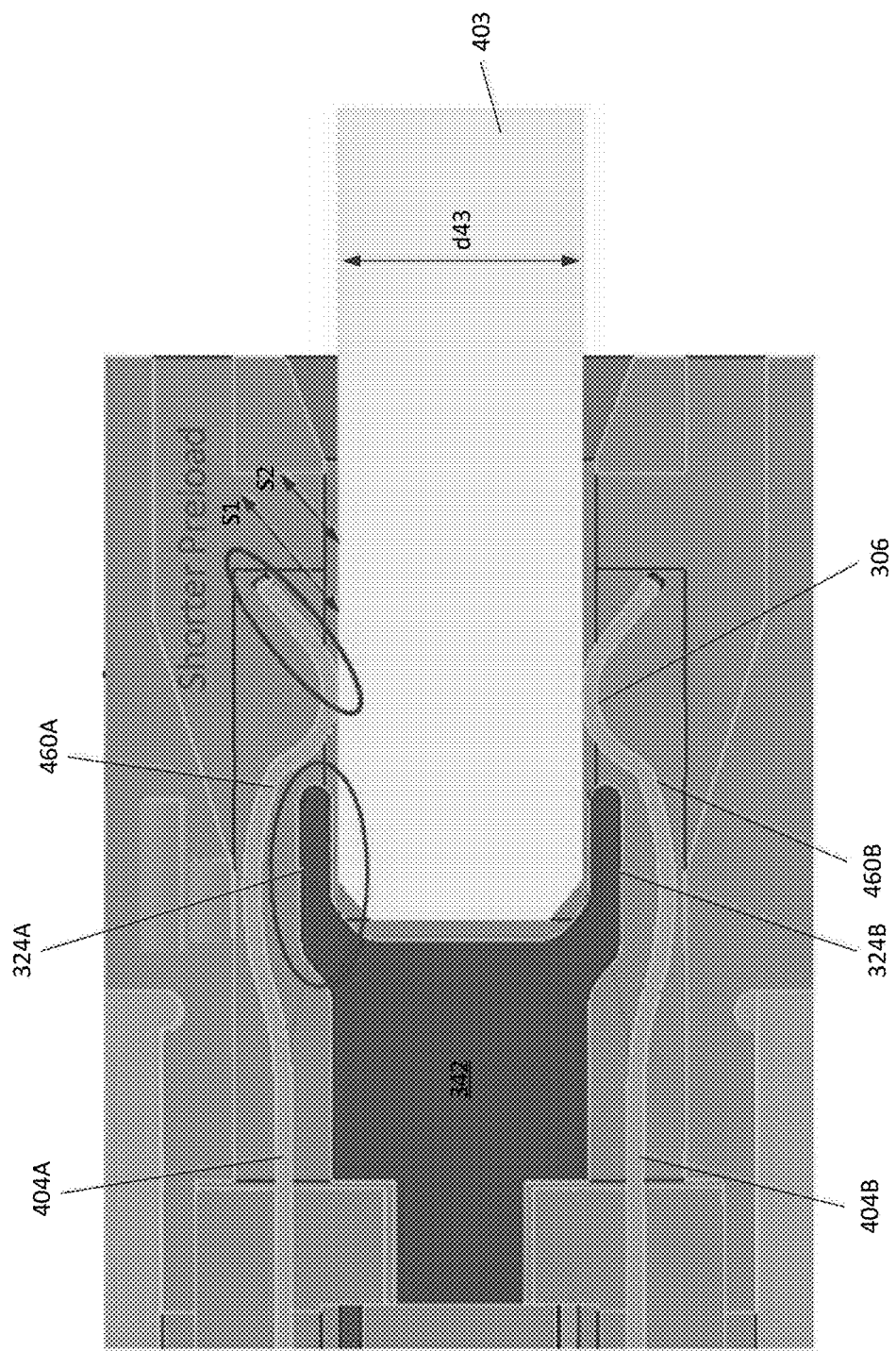
FIG. 4C is a cross-sectional view of the card edge connector of FIG. 4B mated with a card, according to some embodiments.

FIG. 4C is a cross-sectional view of the card edge connector in FIG. 4B mated with a card 403, according to some embodiments. The card may have a thickness d43 greater than d41 and d42. When the card is inserted, conductive element 404A should be separated from conductive element 404B by the distance of d43. As a result, the first and second arms disconnect from locations 460A, 460B. In the embodiment illustrated, member 314 has first and second arms 324A and 324B that provide a U-shaped front portion facing the card 403. As a result, card 403 fits between the arms and each of the arms is positioned between the card and the intermediate portion of the at least one second type conductive element along the transverse direction.

A method of manufacturing the card edge connector may comprise: forming leadframe assemblies including conductive elements; mounting the member to the center housing; and mounting the leadframes to the center housing through matching joints 350, 352 such that the conductive elements are flexed away from rest states as a result of contacting member 414. The method may further comprise mounting the subassemblies to the lower housing; mounting the upper housing to the lower housing; and mounting the front housing to the upper and lower housing. It should be appreciated that manufacturing a connector within the scope of the invention may not require all of above mentioned steps or may not require the steps in the exact order in the exemplary embodiment described herein.

In the embodiment illustrated, member 314 is positioned between lead frame assemblies 330A and 330B. Affixing lead frame assemblies to each other, either directly or indirectly by affixing both to a separate component such as central housing 342 may squeeze member 314 between lead frame assemblies 330A and 330B. This squeezing action may press the contact portions of the conductive elements of lead frame assemblies 330A and 330B against the arms of member 314 and may deflect the conductive elements.

A method of operating the connector 200 may comprise inserting the card into the opening; engaging the card with the contact portions of the conductive elements; and disconnecting the conductive elements from the member at the location farther from the mating end than the contact portions of the conductive elements.

Although details of specific configurations of conductive elements and housing members are described above, it should be appreciated that such details are provided solely for purposes of illustration, as the concepts disclosed herein are capable of other manners of implementation. In that respect, various connector designs described herein may be used in any suitable combination, as aspects of the present disclosure are not limited to the particular combinations shown in the drawings.

Having thus described several embodiments, it is to be appreciated various alterations, modifications, and improvements may readily occur to those skilled in the art. For example, preloading techniques are illustrated in connection with a cable connector. These techniques may be used in connectors of any suitable configuration, including edge-mounted connectors, surface mount connectors, and connectors with pressfit contact tails. Moreover, though preloading is useful in connection with connectors that receive a card edge, these techniques may be used in connectors that receive mating connectors or other suitable mating components.

Such alterations, modifications, and improvements are intended to be within the spirit and scope of the invention. Accordingly, the foregoing description and drawings are by way of example only.

Various changes may be made to the illustrative structures shown and described herein. For example, the illustrated example shows conductive two rows of conductive elements on opposed sides of a connector opening. However, a connector may include a single row of conductive elements according to some embodiments.

Furthermore, although many inventive aspects are shown and described with reference to a card edge connector, it should be appreciated that aspects of the present disclosure is not limited in this regard, as the techniques used to spread preloaded contacts described herein, whether alone or in combination with one or more other inventive concepts, may be used in other types of electrical connectors, such as backplane connectors, mezzanine connectors, cable connectors, stacking connectors, I/O connectors, chip sockets, etc.

The present disclosure is not limited to the details of construction or the arrangements of components set forth in the foregoing description and/or the drawings. Various embodiments are provided solely for purposes of illustration, and the concepts described herein are capable of being practiced or carried out in other ways. Also, the phraseology and terminology used herein are for the purpose of description and should not be regarded as limiting. The use of "including," "comprising," "having," "containing," or "involving," and variations thereof herein, is meant to encompass the items listed thereafter (or equivalents thereof) and/or as additional items.

What is claimed is:

1. A connector comprising:
a housing comprising an opening at an end and a member; and
at least one compliant, conductive element comprising a contact portion curving inwardly relative to the opening, a tip extending from the contact portion towards a mating end, a mounting end opposite the mating end, and an intermediate portion that extends between the mounting end and the contact portion,
wherein:
the at least one compliant, conductive element has a rest state;
the member contacts the at least one compliant, conductive element from a location farther from the end than the contact portion, and presses against an elongate surface of the intermediate portion of the at least one compliant, conductive element, the elongate surface facing the opening; and
the contact between the at least one compliant, conductive element and the member deflects the at least one compliant, conductive member from its rest state.

2. A connector as recited in claim 1, wherein:
a distance from the of the at least one compliant, conductive element to the contact portion of the at least one compliant, conductive element is less than one half wavelength (in air) at an operating frequency of the connector.

3. A connector as recited in claim 1, wherein the member comprises a first arm, a second arm, and a bridge connecting the first and second arms.

4. A connector as recited in claim 3, wherein:
the at least one compliant, conductive element is at least one first type compliant, conductive element;
the connector comprises at least one second type compliant, conductive element comprising a contact portion curving inwardly into the opening;
the at least one first type compliant, conductive element and the at least one second type compliant, conductive element are on opposite sides of the opening;
the first arm of the member contacts the at least one first type compliant, conductive element from a location farther from the end than the contact portion of the at least one first type compliant, conductive element; and
the second arm of the member contacts the at least one second type compliant, conductive element from a location farther from the end than the contact portion of the at least one second type compliant, conductive element.

5. A connector as recited in claim 1, wherein:
the at least one compliant, conductive elements comprises a plurality of compliant, conductive elements, and
the plurality of compliant, conductive elements are configured into groups comprising two differential signals and corresponding reference signals.

6. A connector as recited in claim 5, wherein:
the member is a first member,
the connector comprises a plurality of like members, the first member is one of the plurality of members, and
each member of the plurality of members contacts a group of compliant, conductive elements from a location farther from the end than the contact portions of the group of compliant, conductive elements.

7. A connector as recited in claim 6, wherein each of the plurality of members comprises a first arm, a second arm, and a bridge connecting the first and second arms.

8. A connector as recited in claim 7, wherein:
the plurality of the at least one compliant, conductive elements are a plurality of first type compliant, conductive elements;
the connector comprises a plurality of second type compliant, conductive elements, each of the plurality of second type compliant, conductive elements comprising a contact portion curving inwardly into the opening;
the plurality of first type compliant, conductive elements and the plurality of second type compliant, conductive elements are on opposite sides of the opening;
the first arm of each of the plurality of members contacts a group of first type compliant, conductive elements from a location farther from the end than the contact portions of the group of first type compliant, conductive elements; and
the second arm of each member contacts a group of second type compliant, conductive elements that are on the side of the opening opposite to the location of the group of first type compliant, conductive elements from a location farther from the end than the contact portions of the group of second type compliant, conductive elements.

9. A connector as recited in claim 5, wherein the housing further comprises a plurality of leadframe assembly housings, each of the plurality of leadframe assembly housings holding at least one group of the at least one compliant, conductive elements.

10. A connector as recited in claim 9, wherein the housing further comprises a front housing comprising walls and chambers separated by the walls, each chamber holding one of the plurality of the at least one compliant, conductive elements.

11. A connector as recited in claim 10, wherein the housing further comprises a center housing having notches sized to receive cables.

12. An electrical assembly comprising:
a card; and
a connector comprising:
a housing comprising an opening at an end a member, and a notch sized to receive a cable;
at least one conductive element comprising a mating end, a mounting end opposite the mating end, a contact portion curving inwardly relative to the opening, and an intermediate portion that extends between the mounting end and the contact portion;
wherein:
the contact portion of the at least one conductive element of the connector engages with the card,
the member is positioned farther from the end than the contact portion of the at least one conductive element along a lateral direction,
at least a portion of the member is positioned between the card and the intermediate portion of the at least one conductive element along a transverse direction perpendicular to the lateral direction, and
a portion of the mounting end of the at least one conductive element extends parallel to the notch.

13. An electrical assembly as recited in claim 12, wherein the member comprises a first arm, a second arm and a bridge connecting the first and second arms.

14. An electrical assembly as recited in claim 13, wherein the at least one conductive element is at least one first type conductive element;
the connector comprises at least one second type conductive element comprising a contact portion curving inwardly into the opening;

the at least one first type conductive element and the at least one second type conductive element are on opposite sides of the opening;

the first arm of the member contacts the at least one first type conductive element from a location farther from the end than the contact portion of the at least one first type conductive element along the lateral direction, and the first arm is positioned between the card and the intermediate portion of the at least one first type conductive element along the transverse direction; and the second arm of the member contacts the at least one second type conductive element from a location farther from the end than the contact portion of the at least one second type conductive element along the lateral direction, and the second arm is positioned between the card and the intermediate portion of the at least one second type conductive element along the transverse direction.

15. A method of manufacturing a connector comprising a plurality of conductive elements having mating ends, mounting ends opposite the mating ends, contact portions curving inwardly, tips extending from the contact portions towards the mating ends, and intermediate portions that extend between the mounting ends and the contact portions, the method comprising:

positioning an insulative member between a first plurality of conductive elements held in a first leadframe assembly and a second plurality of conductive elements held in a second leadframe assembly;

securing the first leadframe assembly to the second leadframe assembly such that contact portions of the first plurality of conductive elements are flexed away from contact portions of the second plurality of conductive elements and that the insulative member presses against elongated surfaces of the intermediate portions of the first and second plurality of conductive elements; and mounting the first leadframe assembly and the second leadframe assembly in a housing of the connector such that the contact portions of the first plurality of conductive elements and the contact portions of the second plurality of conductive elements are accessible to mating conductive elements through at least one opening in the housing.

16. The method of claim 15, wherein the securing step comprises squeezing the insulative member between the first and second leadframe assemblies such that a first arm of the insulative member presses against the first plurality of conductive elements and a second arm of the insulative member presses against the second plurality of conductive elements.

17. The method of claim 15, wherein the securing step comprises affixing the first leadframe assembly to the second leadframe assembly such that distal ends of the plurality of conductive elements are protected by walls of the housing.

18. A method of manufacturing the first leadframe assembly of claim 15, the method comprising molding a subassembly housing around intermediate portions of the first plurality of conductive elements such that portions of the first plurality of conductive elements extend from the subassembly housing and form cantilevered beams.

19. The method of claim 18, comprising connecting the plurality of conductive elements with exposed wires of a cable.

20. A method of operating a connector comprising a housing comprising an opening at an end and a member, and at least one conductive element comprising a contact portion curving inwardly into the opening, wherein the member contacts the at least one conductive element from a location farther from the end than the contact portion, the method comprising:

inserting a card into the opening;

sliding the card past distal ends of the at least one conductive element and then engaging the card with the contact portion of the at least one conductive element; and disconnecting the at least one conductive element from the member at the location farther from the end than the contact portion of the at least one conductive element.

* * * * *